United States Patent [19]
Lesk et al.

[11] 4,131,488
[45] Dec. 26, 1978

[54] METHOD OF SEMICONDUCTOR SOLAR ENERGY DEVICE FABRICATION

[75] Inventors: Israel A. Lesk, Scottsdale; Robert A. Pryor, Phoenix, both of Ariz.

[73] Assignee: Motorola, Inc., Schaumburg, Ill.

[21] Appl. No.: 792,438

[22] Filed: Apr. 25, 1977

Related U.S. Application Data

[62] Division of Ser. No. 645,600, Dec. 31, 1975, abandoned.

[51] Int. Cl.$^2$ .................... H01L 21/263; H01L 31/04
[52] U.S. Cl. .................................. 148/1.5; 136/89 R; 357/30; 357/91
[58] Field of Search .............. 136/89; 357/30; 29/572; 148/1.5

[56] References Cited

U.S. PATENT DOCUMENTS

| 3,150,999 | 9/1964 | Rudenberg | 136/89 |
| 3,877,058 | 4/1975 | Cricchi et al. | 357/24 |

FOREIGN PATENT DOCUMENTS 751084 1/1967 Canada ...................................... 356/38
7317345 5/1973 France.

OTHER PUBLICATIONS

J. J. Cuomo et al., "Total Photon Absorption Solar Cell" IBM Tech. Disl. Bull. 18, (1957) 935.
C. R. Baraone et al., V-Grooved Si Solar Cells" Conf. Record, 11th IEEE Photospecialist Conf., May 6-8, 1975.
J. F. Allison et al., "A Comparison of the Conset Violet and Non-Reflective Cells", 10th Intersociety Energy Conversion Conf., Aug. 1975.
L. Forbes, "Photodiodes . . . for Improved Light Sensitivity," IBM Tech. Disl. Bull., 15 (1972) 1348.
C. L. Bertin, "Lateral Transistor with Built—In Electric Field," IBM Tech. Disl. Bull. 16 (1973) 280.

Primary Examiner—R. Dean
Assistant Examiner—Upendra Roy
Attorney, Agent, or Firm—Lowell E. Clark

[57] ABSTRACT

This disclosure relates to a semiconductor solar energy device which is of the PN-type and utilizes a dielectric anti-reflective coating on the side of the device that faces the sunlight. The fabrication techniques used in making this semiconductor device include the use of a rough or textured pyramid shaped silicon surface beneath the anti-reflective coating to increase solar cell efficiency. Also, ion implantation is used to form the PN junction in the device. The ion implanted region located on the side of the device that is subjected to the sunlight is configured in order to permit metal ohmic contact to be made thereto without shorting through the doped region during sintering of the metal contacts to the semiconductor substrate. The dielectric anti-reflective coating, in one embodiment, is a composite of silicon dioxide and silicon nitride layers. The device is designed to permit solder contacts to be made to the P and N regions thereof without possibility of shorting to semiconductor regions of opposite type conductivity.

11 Claims, 2 Drawing Figures

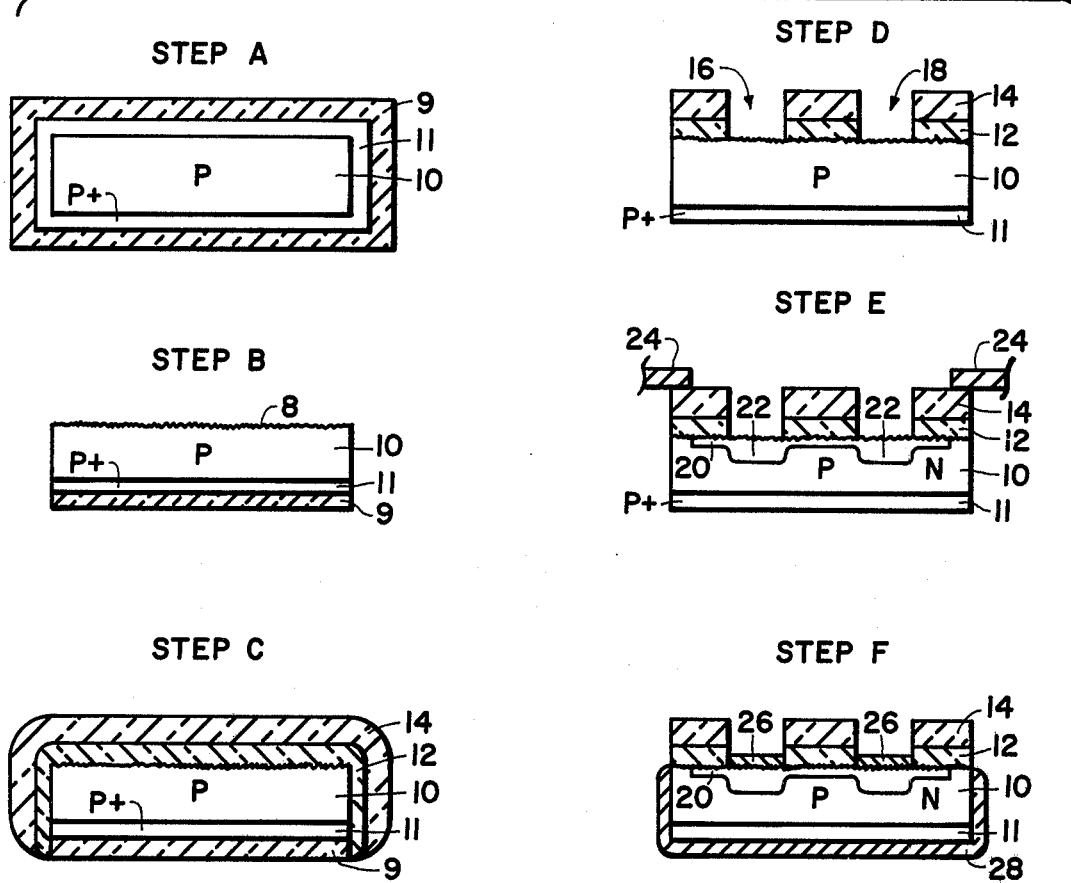
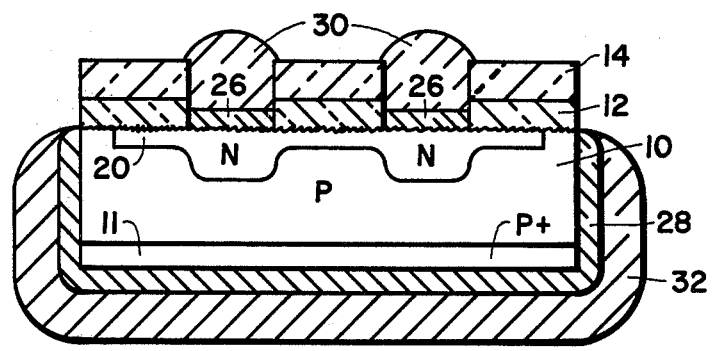

METHOD OF SEMICONDUCTOR SOLAR ENERGY DEVICE FABRICATION

This is a division of application Ser. No. 645,600, filed Dec. 31, 1975, now abandoned.

BACKGROUND OF THE INVENTION

1. Field of the Invention

This invention relates generally to semiconductor solar energy devices and fabrication methods therefor and, more particularly, to semiconductor solar energy devices of the PN diode type having an anti-reflective coating on one side thereof and a textured pyramid shaped silicon surface beneath the anti-reflective coating, and fabrication methods for making such devices.

2. Description of the Prior Art

Prior art techniques and method steps for making semiconductor solar energy devices were generally very complex and therefore very costly. In the past, semiconductor solar energy devices were made using PN diode type structures wherein an anti-reflective coating of a dielectric such as tantalum oxide or silicon monoxide was used on the sunlight-striking side of the solar energy device. These two materials are not commonly used in silicon devices and present manufacturing problems.

In this prior art type of semiconductor solar energy device, ohmic contacts were formed to the backside thereof and also to the front side of the device. The ohmic contacts to the front side of the device which was on the same side as the anti-reflective coating generally provided a problem because these metal contacts very often shorted through the underlying diffused regions into the semiconductor region of opposite type conductivity located beneath the diffused region on which the contacts were located. It was generally undesirable to provide a diffused region on the sunlight striking side of the device which would have a thickness greater than 0.3 microns. The reason for this is that a shallow PN junction is necessary for optimum collection of generated electron-hole pairs created by photon bombardment when subjected to solar energy. Consequently, during sintering of the metal ohmic contacts on the sunlight-striking side of the prior art semiconductor solar energy devices punch through or shorting problems developed in fabricating these types of devices because of the presence of this thin diffused region on the sunlight striking side of the device and the metal penetration during sintering.

Another problem associated with the prior art semiconductor solar energy devices is that the metal contacts that were applied to the semiconductor solar energy device required several costly or low manufacturing yield steps which made the prior art devices either unreliable or more expensive to manufacture.

The utilization and desirability of a rough solar cell surface, consisting of a uniform distribution of minute pyramids, to increase solar cell efficiency has been demonstrated. This rough or textured surface causes all the light that is reflected from the first impingement on the rough solar cell surface to strike the solar cell at least a second time (assuming initial normal incidence). This second impingement increases the amount of light absorbed in the solar cell, improving cell efficiency. Such a solar cell has recently been exhibited by COMSAT.

There are other advantageous features of such a textured surface on a solar cell. The major effect is that, since light is refracted into the silicon at an angle to the normal of the overall solar cell plane, more light is absorbed within a given thickness of silicon than would occur with normally incident sunlight on a smooth-surfaced solar cell.

However, prior art etchants used to create such a textured pyramid shaped silicon surface were generally unstable or produced variable results, and thus are undesirable for use in manufacturing large quantities of semiconductor solar energy devices. Furthermore, prior art silicon solar cells did not use a textured pyramid shaped silicon surface in combination with other features such as an anti-reflective coating containing dielectric materials that have been used in semiconductor processing, ohmic metal contacts that will not short through a thin doped region of the solar energy device, etc.

An optimum process for solar cells should have the following features:

1. Minimum number of total steps.
2. Minimum number of photoresist steps.
3. Dopant concentration a maximum at the semiconductor surface, monotonically decreasing into the bulk.
4. Heavier dopant concentration below metallization areas for improved ohmic contact.
5. Greater junction depth below metallization than active areas to reduce the possibility of metal punch-through, while retaining cell sensitivity.
6. Have an anti-reflective coating.
7. Have a textured pyramid shaped silicon surface.
8. Minimize wafer exposure time to high temperatures.

A need existed for providing a semiconductor solar energy device and process therefor that would overcome these disadvantages of prior art devices and processes and which would have the above identified process features to permit large quantities of these devices to be manufactured at relatively lower cost.

SUMMARY OF THE INVENTION

According, it is an object of this invention to provide an improved semiconductor solar energy device and fabrication method therefor.

It is another object of this invention to provide an improved semiconductor solar energy device and fabrication method therefor which has reliable ohmic contacts that do not short out to a semiconductor region of opposite type conductivity located beneath the semiconductor region to which the ohmic contacts are made.

It is still a further object of this invention to provide a semiconductor solar energy device and fabrication methods therefor which is designed to prevent shorting from the metal contacts to a PN junction located in the substrate.

It is still another object of this invention to provide a semiconductor solar energy device and fabrication method therefor which utilizes an improved anti-reflective coating or layered structure which consists of semiconductor compatible materials that are easily applied using semiconductor manufacturing techniques.

It is a further object of this invention to provide a semiconductor solar energy device and fabrication method therefor which utilizes an improved anti-reflective coating containing semiconductor compatible materials in combination with a textured or rough silicon surface located beneath the anti-reflective coating to increase incident light absorption in the device and thereby increase the efficiency of the device.

It is a still further object of this invention to provide a simplified manufacturing process for making an improved semiconductor solar energy device.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIG. 1 illustrates a side elevation sectional view depicting a series of steps in the process of fabricating the semiconductor solar energy device of this invention.

FIG. 2 depicts the semiconductor solar energy device of the last step of FIG. 1 with the addition of the solder metal contacts in electrical contact with the ohmic contacts on the top and bottom portions of the semiconductor solar energy device.

DESCRIPTION OF THE SPECIFICATION

Referring to Step A of FIG. 1, a semiconductor wafer or substrate 10 is used as the starting point for fabricating the semiconductor solar energy device of this invention. The semiconductor wafer or substrate 10 can be formed by various techniques including crystal pulling and subsequent wafer cutting and polishing or by other techniques such as dendritic growth or ribbon growth. Preferably, in this embodiment, the starting substrate for wafer 10 is of P-type conductivity which means that it is a semiconductor substrate or wafer such as silicon doped with an impurity which would exhibit P-type electrical conductivity characteristics. Examples of such dopants that would provide a P-type substrate or wafer are boron or aluminum. If desired, the starting wafer or substrate 10 can be of N type conductivity and the subsequently doped regions would be of opposite type conductivity to that described below. The P-type substrate 10 preferably has a thickness of about 10 mils, but can be made with a thickness in the range of about 1–20 mils, and a resistivity in the range of from about 0.1 to about 20 ohm-centimeters. A P+ region 11 is preferably diffused into the substrate 10 in order to form a continuous doped region on all surfaces of the substrate 10. A preferred dopant for the P+ region is boron, and a preferred source for the boron is boron trichloride. The boron trichloride releases chlorine in the diffusion chamber, this chlorine serves to remove some undesirable impurities from the surface of the silicon wafer, resulting in a depletion of such impurities from the bulk of the wafer 10 by diffusion to the surface and removal by the chlorine. This getter action results in obtaining or preserving high minority carrier lifetime in the silicon wafer. The P+ region 11 has a surface impurity concentration of about $10^{21}$ atoms per cubic centimeter of, for example, boron atoms and serves to provide a semiconductor region that will permit a good ohmic contact to be made to the entire back side portion of the device and thereby provide an excellent electrical contact to the semiconductor substrate 10. Additionally, the P+ region 11 provides a back surface electric field to aid in collecting minority carriers generated in the substrate 10.

During formation of the P+ doped region 11, a protective silicon dioxide layer 9 is formed on all surfaces of the substrate. The bottom surface of the wafer is then protected by an etch resist and the silicon dioxide and P+ regions on the top and sides of the wafer are stripped or etched away to expose the silicon substrate 10.

The front side silicon surface is now ready for a surface etchant treatment to form the serrated surface 8 first shown in Step B of FIG. 1. This serrated or rough surface is located beneath the anti-reflective layer that is formed in subsequent steps and serves to provide the photon absorption function described herein. The etchant that is used to form this serrated or rough surface is more fully described in the copending U.S. patent application entitled "SILICON SURFACE ETCHANT" filed simultaneous herewith and in the names of Bailey et al. and assigned to the same assignee of this application.

The serrated or rough surface has small pyramid shapes that are formed by the etchant described in said Bailey et al. patent application. In one embodiment, the silicon substrate 10 has a (100) crystallographic orientation and the facets of the small pyramids formed on the surface have a {111} orientation. The angle formed by the apex of the pyramid was approximately 70° and the depth of the facets of the pyramid varied from 10 microns to submicron size (less than 0.1 microns). Thus, photons of light striking any portion of the pyramid shaped surface and not absorbed would be reflected to an adjacent portion of this rough surface and have a second chance at being absorbed into the silicon surface. Referring to Step C of FIG. 1, a thin silicon dioxide layer 12 is preferably grown on the surface of the starting P-type substrate 10. The thin silicon dioxide layer 12 preferably has a thickness of between about 50 to about 300 Angstroms and most desirably has a thickness of between about 75 to about 100 Angstroms. This thin silicon dioxide layer 12 is necessary for achieving minimum surface state density and low recombination velocity.

Referring further to Step C, a thicker silicon nitride layer 14 is deposited or formed on the top of the thin silicon dioxide layer 12. The silicon nitride layer is deposited by various well known silicon nitride chemical vapor deposition techniques and is preferably deposited at a temperature of 750° C or less to preserve etchability in HF solutions. The silicon nitride layer 14 has a thickness of about 1,000 Angstroms and the silicon dioxide layer 12 together with the silicon nitride layer 14 form the anti-reflective coating that is needed for the semiconductor solar energy device of this invention. The function of the anti-reflective coating or layer which is comprised of the silicon nitride layer 14 and the silicon dioxide layer 12 is to enhance the absorption of photons of light striking the anti-reflective layer into the semiconductor substrate or wafer. Accordingly, the thicknesses of the silicon nitride layer 14 and the silicon dioxide layer 12 together with the index of refraction of both the silicon nitride material and the silicon dioxide material serve to provide an excellent anti-reflective layer or coating for the semiconductor solar energy device of this invention. The use of these dielectric materials is well known in the semiconductor arts for other types of applications.

Referring to Step D, holes 16 and 18 are opened up through the silicon nitride layer 14 and the silicon dioxide layer 12 by using conventional photolithographic masking and etching techniques using an HF solution. Holes 16 and 18 are part of a continuous opening through the anti-reflective coating. The purpose of this step in the process of fabricating the semiconductor solar energy device of this invention is to define the geometry of metal ohmic contacts that will provide an electrical contact to the underlying semiconductor region. However, before the ohmic contacts are formed or deposited in the openings 16 and 18 these openings are used to provide a differential PN junction depth as shown in step E.

With regard to step E of FIG. 1, a doped region 20 having two different depths is formed preferably using ion implantation techniques, but conventional diffusion techniques can be combined with the ion implantation doping techniques, if desired.

The doped region 20 which is of N-type conductivity and having an average impurity concentration in the range of about $10^{18}$ to about $10^{20}$ impurities per cubic centimeter is formed by an ion implantation technique using a substrate or wafer holder 24 which is preferably made of metal and serves to hold the entire structure in position for the ion bombardment of the N-type impurities into the substrate 10. As can be seen with reference to the ion implanted region 20, a region beneath the metal holder 24 in the P-type substrate 10 is not converted to N-type conductivity due to the shielding effects of the metal holder 24. Thus, it can be readily apparent with respect to FIG. 2, the PN junction formed between region 20 and the substrate 10 does not extend out to the side of the substrate 10.

As can be seen with reference to Step E of FIG. 1, the ion implantation process that is carried out causes a doped region to form beneath the anti-reflective layer or coating. This is created beneath the anti-reflection layer or coating by the penetration of ions therethrough.

As can be seen with reference to Step E of FIG. 1, a deeper doped region 22 is shown in the region beneath the openings 16 and 18. This occurs because the implanted ions in the semiconductor material beneath the openings 16 and 18 did not have to go through the anti-reflective coating. The portion of the doped region 20 that is underneath the anti-reflective coating has an impurity concentration profile which preferably provides the maximum concentration of impurities at a silicon-silicon dioxide interface and the impurity concentration is graded and decreases in concentration with increasing depth from the silicon-silicon dioxide interface. This is accomplished by selecting an ion implantation energy which will insure that the maximum concentration is preferably at the silicon-silicon dioxide interface or slightly above this interface and in the anti-reflective coating. This portion of the doped region 20 that is underneath the anti-reflective coating will have a PN junction depth of about 0.3 microns or less. The purpose of the deeper doped regions 22 is to provide deeper doped regions beneath the subsequent location of metal ohmic contacts and thereby to serve to protect the device from shorting when the ohmic contact is sintered to provide a good electrical and mechanical contact to the semiconductor device.

In Step F, an electroless metal deposition operation is carried out wherein metal contacts 26 are formed in the openings 16 and 18 located in the anti-reflective coating. These electroless metal coatings 26 are formed in an electroless plating operation and create ohmic contacts to the N-type doped region 20 located on the substrate region 10. Simultaneous with the formation of the electroless metal ohmic contacts 26 is the formation of a thin metal ohmic contact 28 which is also an electroless contact and is located on the back of the doped region 11 on the substrate 10. The electroless plating process to provide these ohmic contacts utilizes a plating solution which deposits a metal such as nickel into the exposed bare silicon regions. Thus, there is no need for separate photoresist, alignment etching operations. If desired, contacts can be made to the front and backside of the silicon semiconductor solar energy device shown in Step F by using standard metal evaporation or sputtering techniques using a metal evaporation mask that has been aligned to the pattern illustrated by openings 16 and 18. Also, electroplating can be used. If desired, sintering or alloying steps can be carried out subsequent to the deposition of the metal contact material to provide a good mechanical bond and electrical ohmic contact to the substrate and the doped regions thereof.

Referring to FIG. 2, a complete semiconductor solar energy silicon device is shown of the type fabricated in accordance with the Steps A through F of FIG. 1 with the addition of a solder contact 30 that is made to the metal contacts 26 on the top portion of the semiconductor solar energy device and a similar solder contact 32 that is made to the backside portion of the semiconductor solar energy device and specifically in contact with the electroless metal coating 28 located in contact with the P+ doped region 11. This is done by conventional soldering techniques.

While the invention has been particularly shown and described in reference to the preferred embodiments thereof, it will be understood by those skilled in the art that changes in form and details may be made therein without departing from the spirit and scope of the invention.

We claim:

1. A process for forming a semiconductor solar energy device comprising the steps of:
providing a silicon wafer of a first conductivity type with two major surfaces;
introducing a doping impurity of said first conductivity type into both major surfaces simultaneously;
forming an oxide layer on both major surfaces following the introduction of said doping impurities;
removing said oxide layer from a first major surface of said wafer;
treating said first major surface to form a textured pyramidal surface structure while masking a second major surface opposite said first major surface from said texture treating;
forming a thin layer of silicon dioxide in contact with said first major surface;
forming a thin layer of silicon nitride on said layer of silicon dioxide to form an antireflective coating; and
forming a shallow layer of semiconductor material of a second conductivity type opposite said first conductivity type of said first major surface.

2. A process according to claim 1 where said thin layer of silicon dioxide is formed by thermal oxide growth.

3. A process according to claim 1 where said shallow layer of semiconductor material of second conductivity type is formed by ion implantation.

4. A process according to claim 1 further including:
opening at least one hole through said silicon nitride and said silicon dioxide layers, ion implanting through said hole and said nitride and oxide layers to form said shallow layer of semiconductor material of said second conductivity type.

5. The process of claim 4, where said shallow layer is deeper under said hole than under said antireflective coating.

6. A process for the fabrication of a semiconductor solar energy comprising the steps of forming layers of enhanced conductivity on both surfaces of a semiconductor substrate of one type conductivity, selectively masking one of said surfaces, etching the other of said surfaces to remove one of said layers of enhanced conductivity and provide a pyramidal surface texture, forming a thin layer of silicon dioxide on said other surface and a thicker layer of silicon nitrite on said layer of silicon cioxide to provide an antireflective coating of said device, and forming a thin layer of second conductivity type opposite said one type conductivity under said antireflective coating.

7. The process of claim 6, further including forming at least one aperture in said antireflective coating and forming a region of said second conductivity type beneath said aperture.

8. The process of claim 6, where the forming of said thin layer of second conductivity type is effected by ion implantation, and further including shadow masking of the periphery of said substrate to prevent said thin layer from extending to the sides of the substrate.

9. The process of claim 6 where said selective masking prevents the texturing of said one surface.

10. The process of claim 7, where said region is coextensive with said aperture.

11. The process of claim 7, where said region of second conductivity type penetrates said substrate further than said thin layer of second conductivity type.

* * * * *